United States Patent
Liu et al.

(10) Patent No.: US 11,515,418 B2
(45) Date of Patent: Nov. 29, 2022

(54) VERTICAL TUNNELING FINFET

(71) Applicant: STMICROELECTRONICS, INC., Coppell, TX (US)

(72) Inventors: Qing Liu, Irvine, CA (US); John H. Zhang, Altamont, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 16/886,193

(22) Filed: May 28, 2020

(65) Prior Publication Data

US 2020/0295187 A1 Sep. 17, 2020

Related U.S. Application Data

(63) Continuation of application No. 16/026,663, filed on Jul. 3, 2018, now Pat. No. 10,700,194, which is a
(Continued)

(51) Int. Cl.
| | |
|---|---|
| *H01L 29/78* | (2006.01) |
| *H01L 29/66* | (2006.01) |
| *H01L 29/165* | (2006.01) |
| *H01L 29/267* | (2006.01) |
| *H01L 29/737* | (2006.01) |

(Continued)

(52) U.S. Cl.
CPC ........ *H01L 29/7827* (2013.01); *H01L 27/092* (2013.01); *H01L 29/165* (2013.01); *H01L 29/267* (2013.01); *H01L 29/66356* (2013.01); *H01L 29/66666* (2013.01); *H01L 29/7391* (2013.01); *H01L 29/785* (2013.01); *H01L 21/823487* (2013.01);
(Continued)

(58) Field of Classification Search
CPC ............ H01L 29/7391; H01L 29/7827; H01L 29/66666; H01L 21/82285; H01L 21/823885; H01L 21/823487; H01L 29/66356; H01L 29/165; H01L 29/267
See application file for complete search history.

(56) References Cited

U.S. PATENT DOCUMENTS

| | | |
|---|---|---|
| 8,384,122 B1 | 2/2013 | Hu et al. |
| 8,754,470 B1 | 6/2014 | Chuang et al. |

(Continued)

*Primary Examiner* — Aaron J Gray
(74) *Attorney, Agent, or Firm* — Seed Intellectual Property Law Group LLP

(57) ABSTRACT

A tunneling transistor is implemented in silicon, using a FinFET device architecture. The tunneling FinFET has a non-planar, vertical, structure that extends out from the surface of a doped drain formed in a silicon substrate. The vertical structure includes a lightly doped fin defined by a subtractive etch process, and a heavily-doped source formed on top of the fin by epitaxial growth. The drain and channel have similar polarity, which is opposite that of the source. A gate abuts the channel region, capacitively controlling current flow through the channel from opposite sides. Source, drain, and gate terminals are all electrically accessible via front side contacts formed after completion of the device. Fabrication of the tunneling FinFET is compatible with conventional CMOS manufacturing processes, including replacement metal gate and self-aligned contact processes. Low-power operation allows the tunneling FinFET to provide a high current density compared with conventional planar devices.

20 Claims, 8 Drawing Sheets

Related U.S. Application Data continuation of application No. 14/675,298, filed on Mar. 31, 2015, now Pat. No. 10,084,080.

(51) Int. Cl.
  H01L 27/092 (2006.01)
  H01L 29/739 (2006.01)
  *H01L 29/16* (2006.01)
  *H01L 21/8234* (2006.01)
  *H01L 29/49* (2006.01)
  *H01L 29/51* (2006.01)
  *H01L 21/8238* (2006.01)

(52) U.S. Cl.
  CPC .. *H01L 21/823885* (2013.01); *H01L 29/1608* (2013.01); *H01L 29/4958* (2013.01); *H01L 29/517* (2013.01)

(56) References Cited

U.S. PATENT DOCUMENTS

| | | |
|---|---|---|
| 8,759,874 B1 | 6/2014 | Loubet et al. |
| 9,299,835 B1 | 3/2016 | Anderson et al. |
| 2011/0253981 A1* | 10/2011 | Rooyackers ...... H01L 29/66356 977/840 |
| 2012/0187376 A1* | 7/2012 | Tomioka ........... H01L 29/66356 977/762 |
| 2013/0320427 A1 | 12/2013 | Loh et al. |
| 2014/0042524 A1 | 2/2014 | Chuang et al. |
| 2014/0061775 A1 | 3/2014 | Chuang et al. |
| 2014/0167146 A1* | 6/2014 | Kang ................. H01L 29/7391 257/329 |
| 2014/0175554 A1 | 6/2014 | Loubet et al. |
| 2014/0203350 A1 | 7/2014 | Chuang et al. |
| 2014/0203352 A1* | 7/2014 | Chuang ............ H01L 29/66356 257/329 |
| 2014/0231902 A1 | 8/2014 | Chuang et al. |
| 2014/0299923 A1* | 10/2014 | Chang ................ H01L 29/7853 257/288 |
| 2015/0069458 A1* | 3/2015 | Li ....................... H01L 29/7391 257/105 |
| 2015/0129831 A1 | 5/2015 | Colinge et al. |
| 2015/0243707 A1 | 8/2015 | Park |
| 2015/0318213 A1* | 11/2015 | Tsai .................. H01L 29/66666 438/268 |
| 2016/0020306 A1 | 1/2016 | Huang et al. |
| 2016/0093611 A1* | 3/2016 | Cheng .............. H01L 29/78642 257/329 |
| 2016/0268256 A1* | 9/2016 | Yang ............... H01L 21/823487 |

* cited by examiner

VERTICAL TUNNELING FINFET

BACKGROUND

Technical Field

The present disclosure generally relates to various geometries for FinFET devices built on a silicon substrate and, in particular, to FinFETs suitable for low-power applications.

Description of the Related Art

Conventional integrated circuits incorporate planar field effect transistors (FETs) in which current flows through a semiconducting channel between a source and a drain, in response to a voltage applied to a control gate. The semiconductor industry strives to obey Moore's law, which holds that each successive generation of integrated circuit devices shrinks to half its size and operates twice as fast. As device dimensions have shrunk below 100 nm, however, conventional silicon device geometries and materials have experienced difficulty maintaining switching speeds without incurring failures such as, for example, leaking current from the device into the semiconductor substrate. Several new technologies have emerged that allowed chip designers to continue shrinking gate lengths to 45 nm, 22 nm, and then as low as 14 nm.

One particularly radical technology change entailed re-designing the structure of the FET from a planar device to a three-dimensional device in which the semiconducting channel was replaced by a fin that extends out from the plane of the substrate. In such a device, commonly referred to as a FinFET, the control gate wraps around three sides of the fin so as to influence current flow from three surfaces instead of one. The improved control achieved with a 3-D design results in faster switching performance and reduced current leakage. Building taller devices has also permitted increasing the device density within the same footprint that had previously been occupied by a planar FET. Examples of FinFET devices are described in further detail in U.S. Pat. No. 8,759,874 and U.S. Patent Application Publication No. US2014/0175554, assigned to the same assignee as the present patent application.

As integrated circuits shrink with each technology generation, more power is needed to drive a larger number of transistors housed in a smaller volume. To prevent chips from overheating, and to conserve battery power, each generation of transistors is designed to operate at a lower voltage and to dissipate less power. Currently, state-of-the-art transistor operating voltages are in the range of about 0-0.5 V. In a conventional complementary metal-oxide-semiconductor (CMOS) field effect transistor, the source and drain are doped to have a same polarity, e.g., both positive, in a PFET, or both negative in an NFET. When the gate voltage applied to the transistor, VG, exceeds a threshold voltage, VT, the device turns on and current flows through the channel. When the gate voltage applied to the transistor is below the threshold voltage, the drain current, ID, ideally is zero and the device is off. However, in reality, in the sub-threshold regime, there exists a small leakage current that is highly sensitive to the applied voltage. Over time, the leakage current drains charge from the power supply, e.g., a mobile phone battery or a computer battery, thus necessitating more frequent recharging. A change in gate voltage that is needed to reduce the sub-threshold leakage current by a factor of 10 is called the sub-threshold swing. It is desirable for the sub-threshold swing to be as small as possible. It is understood by those skilled in the art that MOSFETs have reached their lower limit of sub-threshold swing, at 60 mV/decade. Thus, a different type of device is needed to further decrease the sub-threshold swing.

Tunneling field effect transistors (TFETs) are considered promising alternatives to conventional CMOS devices for use in future integrated circuits having low-voltage, low-power applications. Unlike a MOSFET, the source and drain of a TFET are doped to have opposite polarity. During operation of the TFET, charge carriers tunnel through a potential barrier rather than being energized to surmount the potential barrier, as occurs in a MOSFET. Because switching via tunneling requires less energy, TFETs are particularly useful in low-power applications such as mobile devices for which battery lifetime is of utmost importance. Another reason TFETs provide enhanced switching performance for low-voltage operation is that TFETs have substantially smaller values of sub-threshold swing than MOSFETs.

BRIEF SUMMARY

A tunneling transistor is implemented in silicon, using a FinFET device architecture. The tunneling FinFET has a non-planar, vertical structure that extends out from the surface of a doped drain region formed in the substrate. The vertical structure includes a lightly-doped fin overlying the doped drain region, and a heavily-doped source region formed on top of the fin. The doped drain region and the fin have similar polarity, while the source has opposite polarity to that of the drain and the fin. The polarities and doping concentrations of the source, drain, and channel regions are designed to permit tunneling of charge carriers during operation of the device. The fin is defined by a subtractive etching process, whereas the source region is formed by epitaxial growth from the fin. Thus, instead of the usual FinFET architecture, in which the source and drain charge reservoirs are located on either end of a horizontal fin channel, the present device has a vertical fin channel which is positioned on top of the drain and underneath the source. A gate abuts opposite sides of the fin, capacitively controlling current flow through the channel, the current flow between the source and the drain being in a transverse direction with respect to a top surface of the substrate. The source, drain, and gate terminals of the vertical tunneling FinFET are all electrically accessible via front side contacts made after the transistor is formed.

Fabrication of the tunneling FinFET is compatible with conventional CMOS manufacturing processes, including replacement metal gate (RMG) and self-aligned contact (SAC) processes. Low-power operation allows the tunneling FinFET to provide a high current density, or "current per footprint" on a chip, compared with conventional planar devices.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

Figure 1:
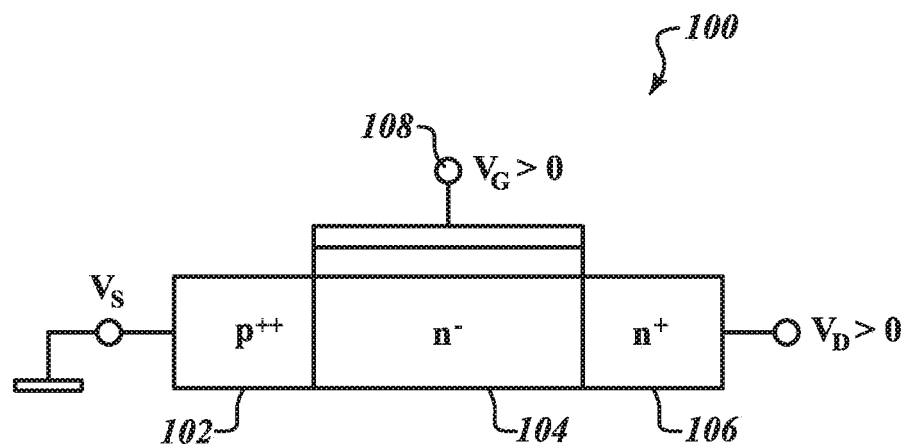
FIG. 1 is a generic circuit schematic diagram of an n-channel tunneling FET (TFET) such as, for example, an n-type tunneling FinFET as described herein.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like, and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to vertical gate-all-around TFET devices that have been produced; however, the present disclosure and the reference to certain materials, dimensions, and the details and ordering of processing steps are exemplary and should not be limited to those shown.

Turning now to the figures, FIG. 1 shows a generic n-type, or n-channel, TFET 100 exemplified by the tunneling FinFET 276 described below. The n-type TFET 100 includes a source terminal 102 that is heavily p-doped, a drain terminal 106 that is n-doped, a channel 104 that is lightly n-doped, and a gate terminal 108. The n-type TFET operates in response to a positive voltage applied to the gate terminal 108. Instead of being an n-p-n transistor, the n-type TFET 100 is an $N^{++}$-$P^-$-$P^+$ device. Such a doping profile causes the energy bands characterizing the silicon at the $P^{++}/N^-$ junction to be arranged so as to allow charge carriers to tunnel through the junction.

Figure 2:
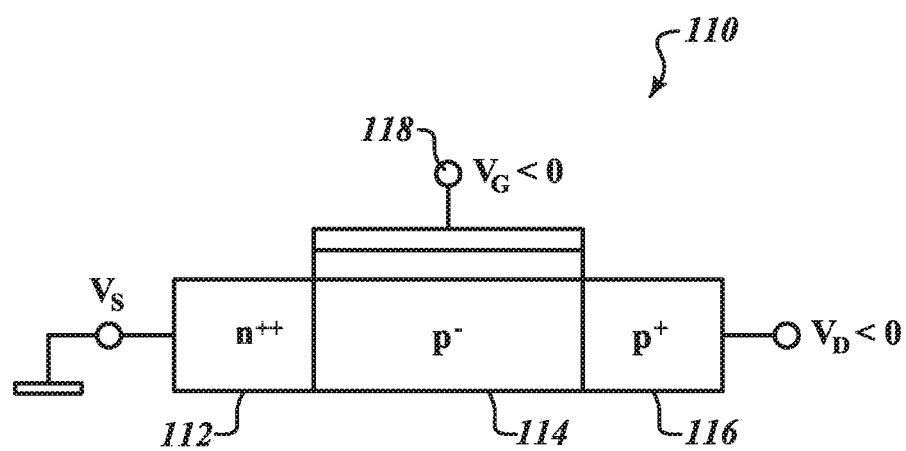
FIG. 2 is a generic circuit schematic diagram of a p-channel tunneling FET (TFET) such as, for example, a p-type tunneling FinFET as described herein.

FIG. 2 shows a generic p-type, or p-channel, TFET 110, exemplified by the tunneling FinFET 274 described below. The p-type TFET 110 includes a source terminal 112 that is heavily n-doped, a drain terminal 116 that is p-doped, a channel 114 that is lightly p-doped, and a gate terminal 118. The p-type TFET 110 operates in response to a negative voltage applied to the gate terminal 118. Instead of being a p-n-p transistor, the p-type TFET 110 is an $N^{++}$-$P^-$-$P^+$ device. Such a doping profile alters the energy bands characterizing the silicon at the $N^{++}/P^-$ junction, permitting charge carriers to tunnel through the junction.

Figure 3:
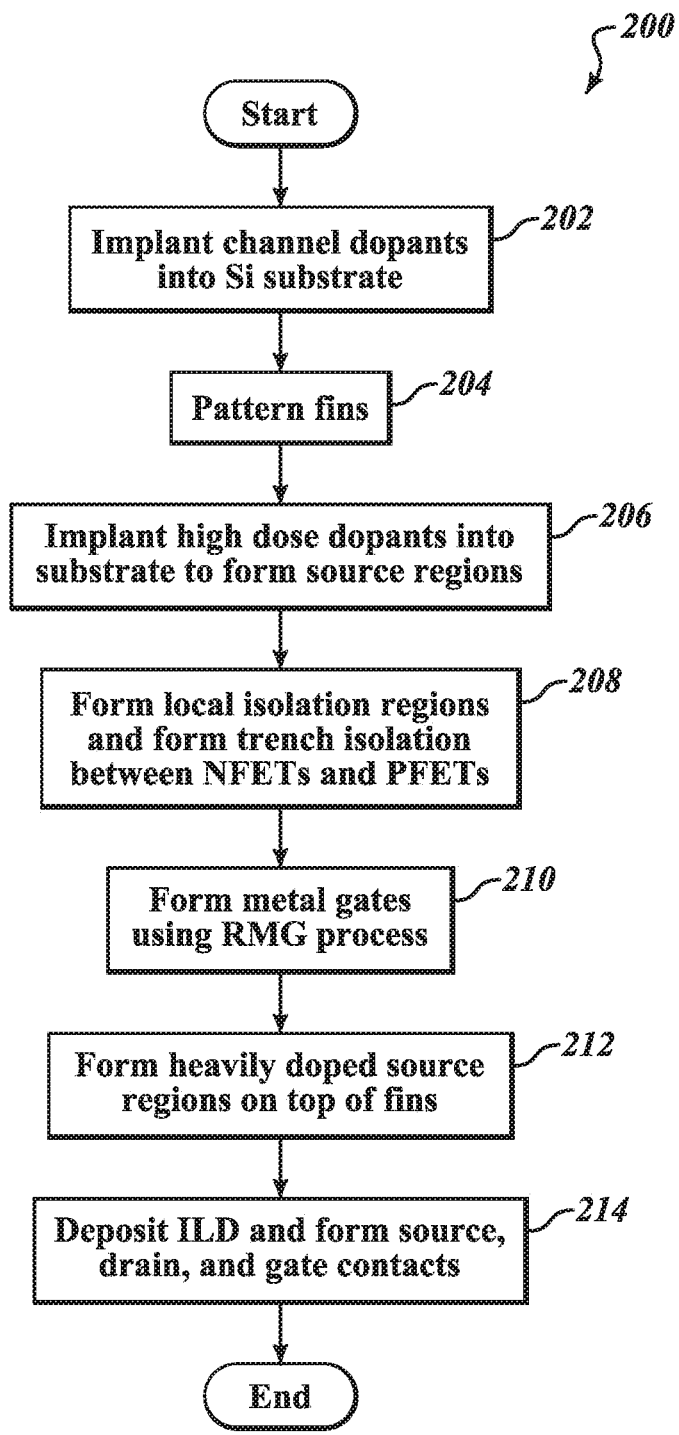
FIG. 3 is a flow diagram showing steps in a method of fabricating a pair of tunneling FinFETs as illustrated in FIGS. 4-15, according to one embodiment described herein.
Figure 11:
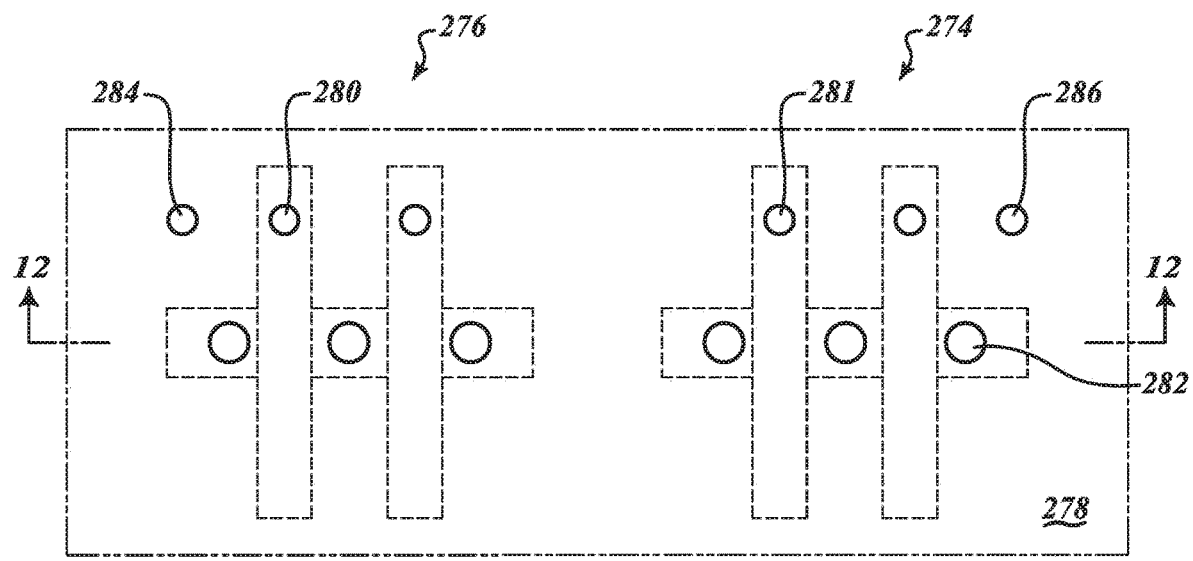
FIG. 11 is a top plan view of the completed pair of tunneling FinFETs after circular contacts have been formed to the source, drain, and gate terminals.
Figure 12:
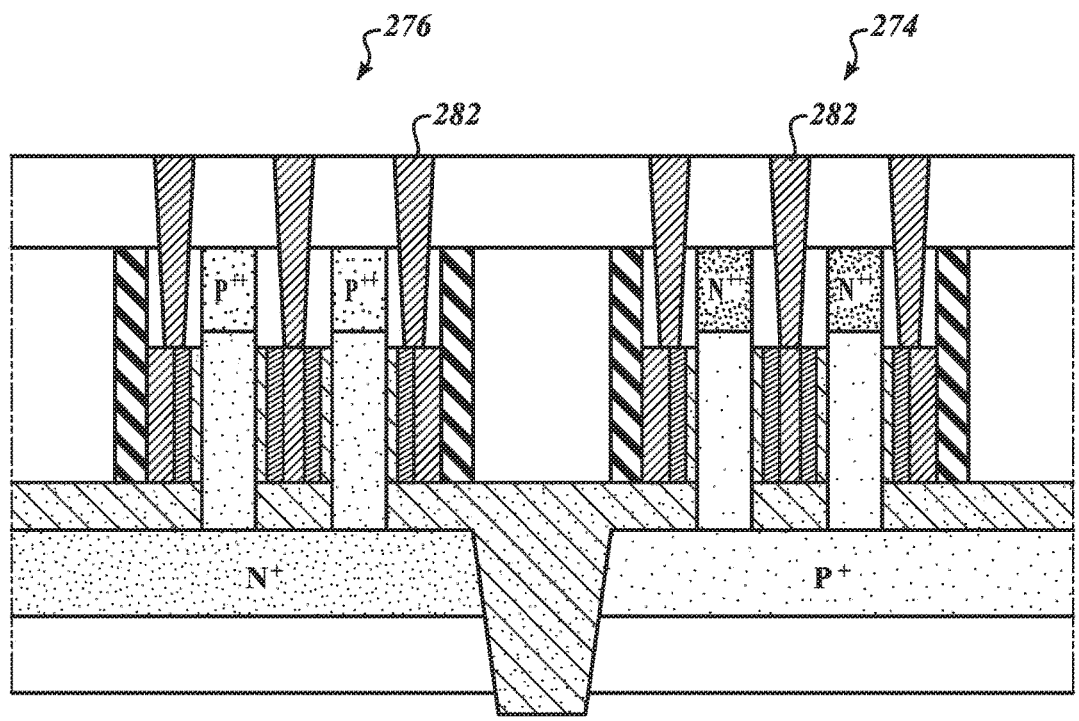
FIG. 12 is a cross-sectional view of the completed pair of tunneling FinFETs shown in FIG. 11, along a cut line through the gate contacts.
Figure 13:
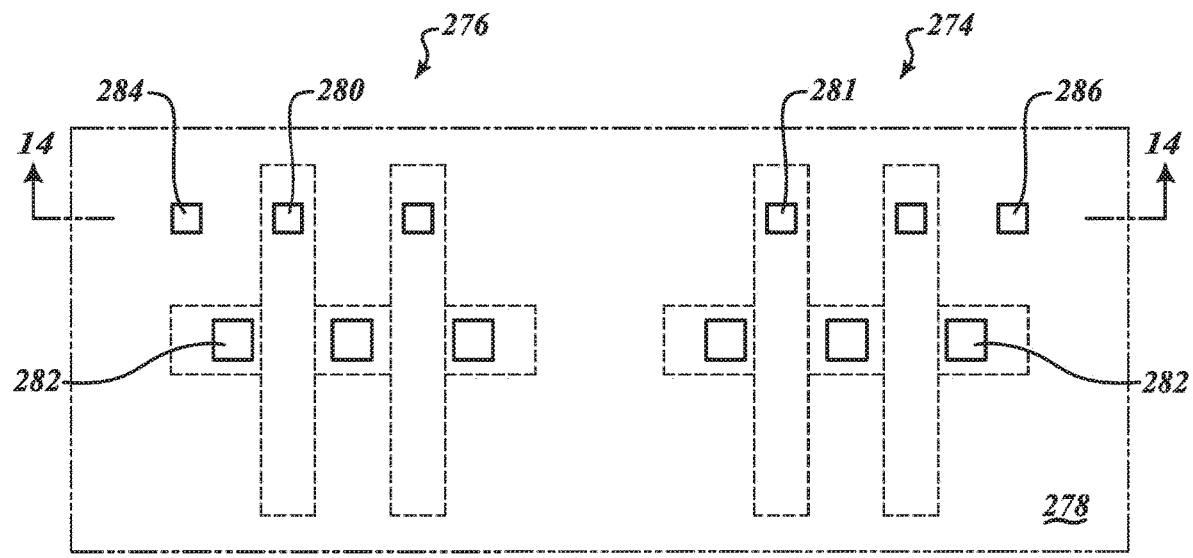
FIG. 13 is a top plan view of the completed pair of tunneling FinFETs after square contacts have been formed to the source, drain, and gate terminals.
Figure 14:
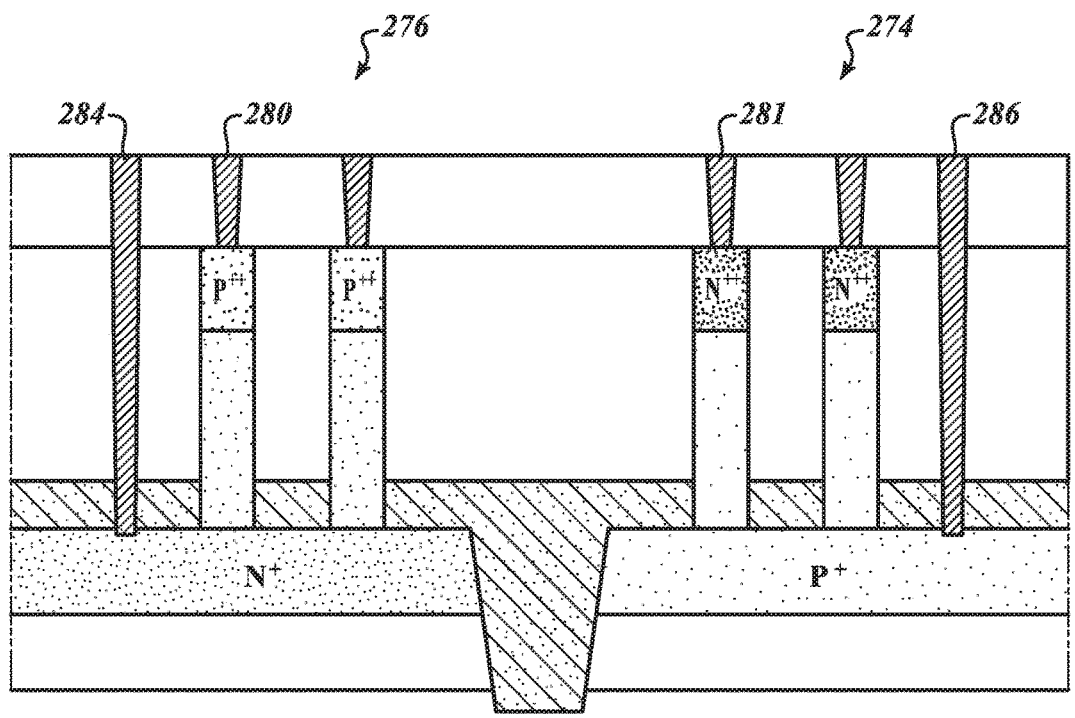
FIG. 14 is a cross-sectional view of the completed pair of tunneling FinFETs shown in FIG. 13, along a cut line through the source and drain contacts.

FIG. 3 shows steps in a method 200 of fabricating a pair of dual tunneling FinFETs 274, 276, according to one embodiment. The completed tunneling FinFET devices produced by the method 200 are shown in FIGS. 11 and 12. Alternative embodiments of the tunneling FinFETs, formed by modifying the method 200, are shown in FIGS. 13-14. Each tunneling FinFET includes a doped lower drain region, a lightly-doped channel region in the form of a fin, and an upper source region that is heavily doped to have a polarity opposite that of the fin and the lower drain region. The channel region extends between the source and drain regions. A gate abuts the fin from two sides so as to influence current flow in the channel in response to an applied voltage. Steps in the method 200 are further illustrated by FIGS. 4-14, and described below.

Figure 4:
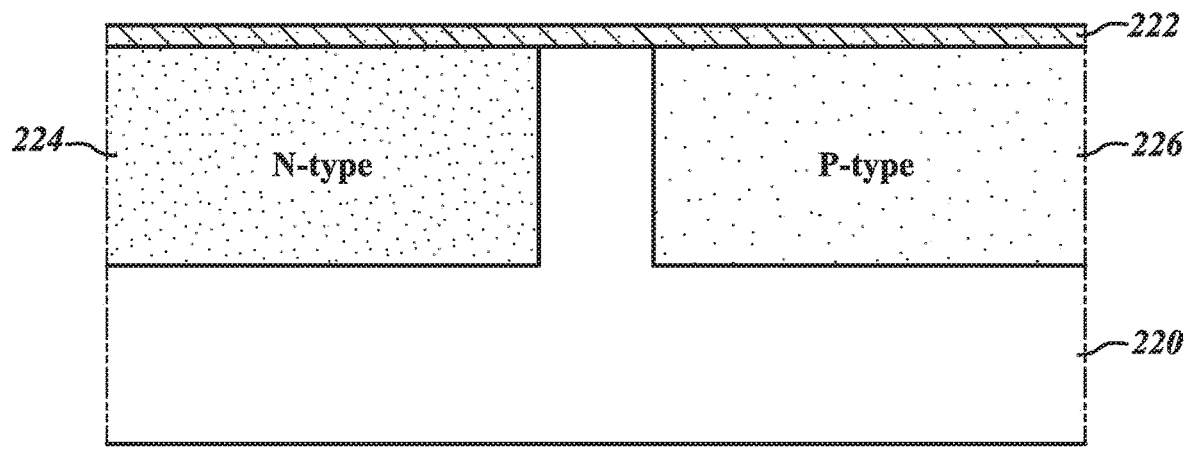
FIGS. 4-9 are cross-sectional views of the pair of tunneling FinFETs at successive steps during fabrication using the method shown in FIG. 3.

At 202, with reference to FIG. 4, a silicon substrate 220 is doped to form an n-type region 224 and a p-type region 226 that will become channel dopants. In one embodiment, the channel dopants are incorporated into the substrate by ion implantation using a hard mask 222, as is well known in the art. The exemplary hard mask 222 is made of silicon dioxide ($SiO_2$) having a thickness of about 3 nm. The hard mask 222 is grown or deposited over the surface of the silicon substrate 220, and is patterned with a first opening to define the n-type region 224, for example. Negative channel dopants such as arsenic or phosphorous ions are implanted into the silicon substrate 220 through the first opening and then annealed to drive in the channel dopants to a selected depth in the range of about 50-60 nm. In one embodiment, the channel dopant concentration is about $1.0\ E19\ cm^{-3}$. Then the hard mask 222 is stripped, re-formed, and patterned with a second opening for the p-type region 226. Positive dopants such as boron ions are then implanted into the silicon substrate 220 through the second opening followed by annealing to drive in the positive dopants to a similar depth and concentration as the n-type region 224. Following implantation, the hard mask 222 is removed. The first and second openings defining the widths of the doped regions 224, 226 can be the same size or different sizes, in the range of about 80-120 nm, targeted at 100 nm, or about 2.5 times the minimum fin pitch. The doped regions 224, 226 are spaced apart by a distance of about 50 nm.

Figure 5:
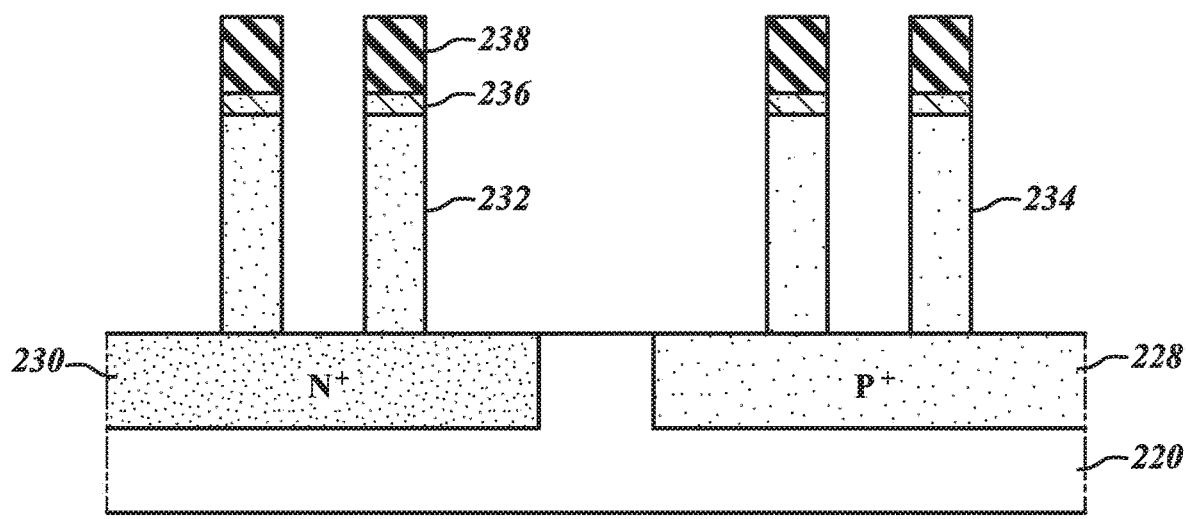

At 204, with reference to FIG. 5, doped fins 232, 234 are patterned, according to one embodiment, by etching the doped regions 224, 226, using a silicon nitride (SiN) fin hard mask 238. First, a pad oxide 236, about 10 nm thick, is grown on the doped silicon substrate 220, followed by deposition of the fin hard mask 238 having a thickness in the range of about 30-50 nm. The pad oxide 236 and the fin hard mask 238 are then patterned with features having a critical dimension between 6-12 nm. Once the fin hard mask 238 is patterned, n-type fins 232 and p-type fins 234 are etched into the doped regions 224, 226, down to the intrinsic substrate 220. The doped fins 232, 234 thus formed will serve as doped channel regions of the tunneling FinFET devices.

Such narrow features may be directly patterned using conventional extreme ultraviolet (EUV) lithography, or by using a self-aligned sidewall image transfer (SIT) technique. The SIT technique is also well known in the art and therefore is not explained herein in detail. The SIT process is capable of defining very high aspect ratio fins 232, 234 using sacrificial SiN sidewall spacers as a fin hard mask 238. According to the SIT technique, a mandrel, or temporary structure, is formed first, on top of the doped regions 224, 226. Then a silicon nitride film is deposited conformally over the mandrel and planarized, forming sidewall spacers on the sides of the mandrel. Then the mandrel is removed, leaving behind a pair of narrow sidewall spacers that serve as the fin hard mask 238. Using such a technique, very narrow mask features can be patterned in a self-aligned manner, without lithography.

At 206, the substrate 220 is again implanted, this time with higher concentration dopants to form $N^+$ and $P^+$ doped drain regions, 230, 228, underneath the doped fins 232, 234, respectively. The higher-concentration dopants are implanted normal to the surface of the substrate 220 using a similar sequential masking process as described above for the n-type and p-type doped regions 224, 226. A conventional photoresist mask is suitable for use in step 206. Alternatively, a tri-layer soft mask that includes an organic planarizing layer (OPL), a silicon anti-reflective coating (Si-ARC), and a photoresist is sufficient for use in implanting the doped drain regions 230, 228. The $N^+$ and $P^+$ doped drain regions 230, 228 are targeted to extend into the silicon substrate 220 to a depth in the range of about 20-30 nm below the bottom of the fins 232, 234, at a concentration of about $1.0\ E\ 20\ cm^{-3}$. The substrate can then be annealed to drive the dopants laterally underneath the fins 232, 234.

Figure 6:
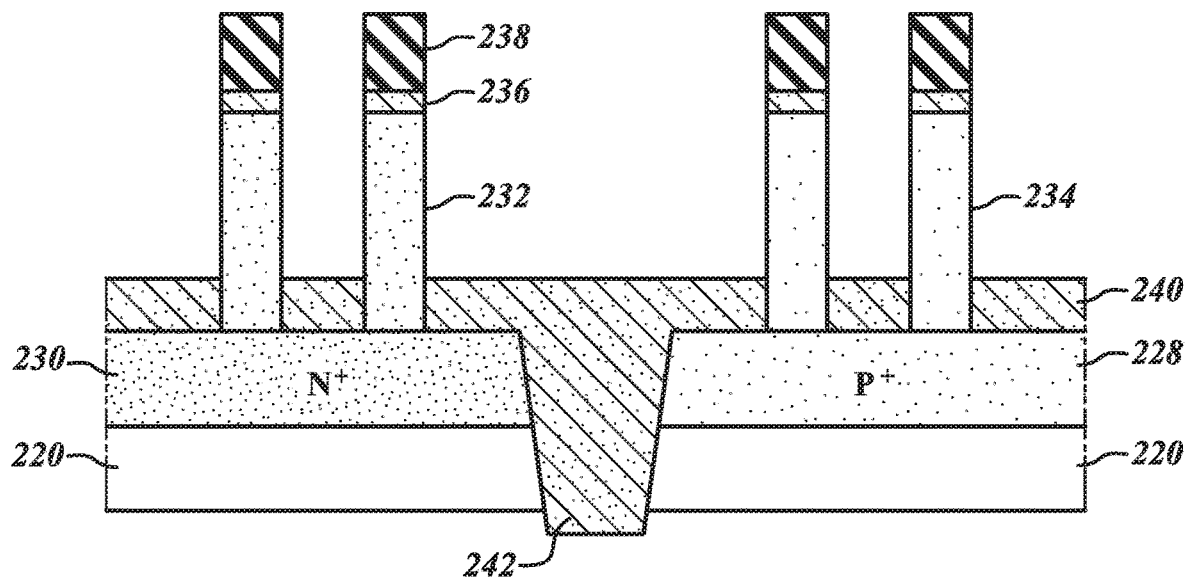

At 208, with reference to FIG. 6, local isolation regions 240 are formed between the fins, and trench isolation regions 242 are formed in the silicon substrate 220 to separate the p-type and n-type devices. According to one embodiment, the local isolation regions are formed by covering the fins with a thick layer of oxide. The trench isolation region 242 is filled to a depth of 200 nm between the NFET and PFET devices being fabricated, at the same time that the fins are covered with the thick oxide layer. Next, the thick oxide layer is planarized using a CMP process that stops on the SiN fin hard mask 238. Then the thick oxide layer is recessed to reveal the fins 232, 234, leaving an oxide thickness of 10-20 nm between the fins.

Figure 7:
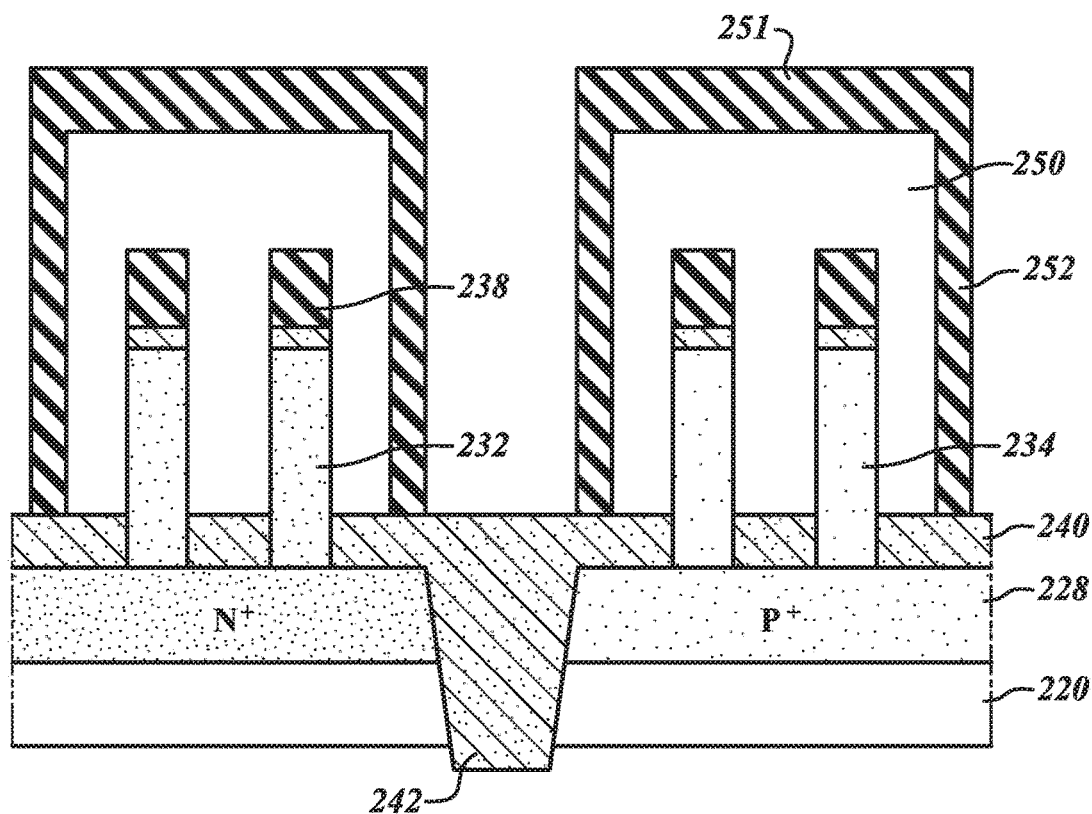
Figure 8:
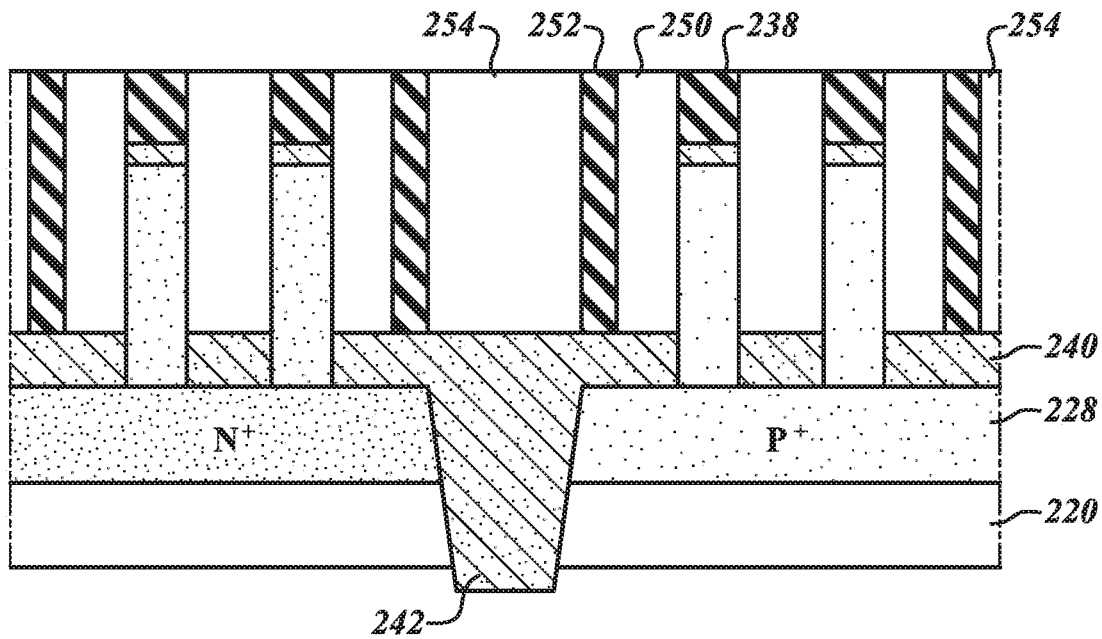
Figure 9:
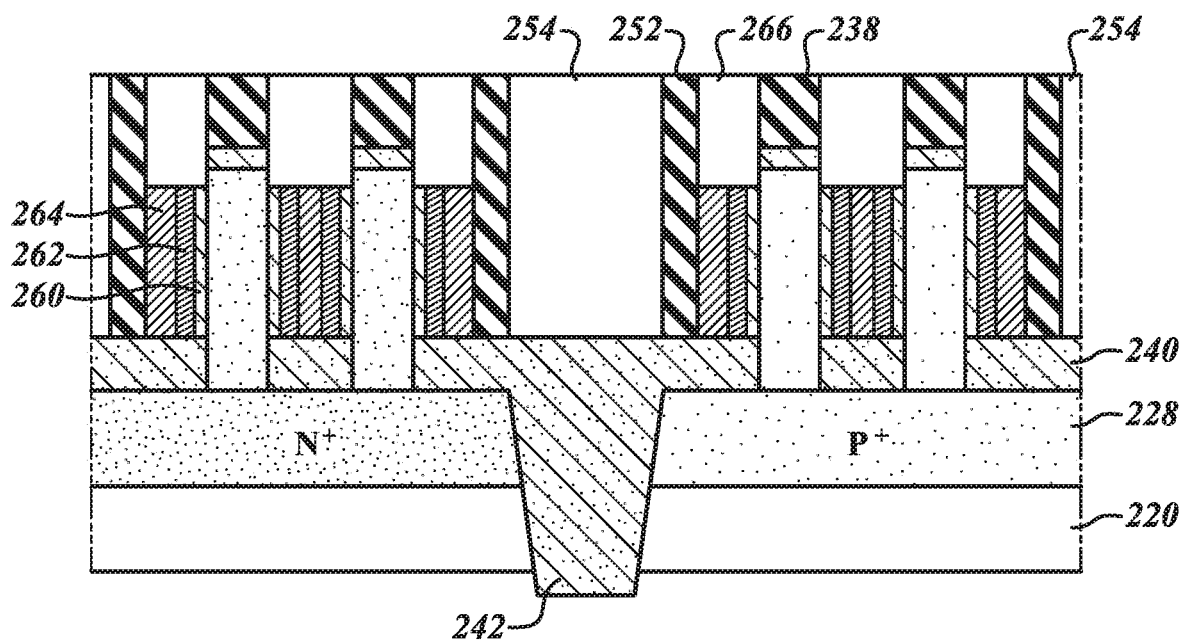

At 210, with reference to FIGS. 7-9, a multi-layer gate structure is formed by a replacement metal gate process, as is known in the art. According to one embodiment, a dummy gate 250 is formed around each pair of fins 232, 234. The dummy gate 250 can be formed by depositing a polysilicon layer to a height of about 80-90 nm above the fin hard mask 238. Alternatively, the fin hard mask 238 and the pad oxide 236 can be removed from the fins 232, 234, and the polysilicon can be deposited directly over the fins 232, 234. The polysilicon layer is then patterned to remove polysilicon material over the trench isolation region 242. The polysilicon width scales with the pitch of the fins 232, 234. Next, a SiN layer is deposited conformally over the patterned polysilicon. The SiN layer is then patterned to remove SiN over the trench isolation region 242. The SiN layer thus forms a gate hard mask 251 on top of the polysilicon layer and isolation walls 252 on the sides of the dummy gate 250, the isolation walls 252 having a thickness in the range of about 5-10 nm. The gate hard mask 251 can be made thicker than the isolation walls 252 by adjusting widths of the mask openings exposing the trench isolation regions 242 when patterning the SiN layer, as shown in FIG. 7.

Next, an inter-layer dielectric (ILD) 254, e.g., $SiO_2$, is deposited to fill spaces between adjacent isolation walls 252. The ILD 254 is then planarized, stopping on the fin hard mask 238, as shown in FIG. 8.

Next, the polysilicon dummy gates 250 are removed and replaced with metal gates. In one embodiment, the dummy gate removal step uses a combination of wet and dry etch processes. The etchant used to remove the dummy gates is selective to the SiN of the gate hard mask 251 and the isolation walls 252, as well as the doped silicon fins 232, 234.

Finally, multi-layer replacement metal gates are formed in place of the dummy gates 250, as shown in FIG. 9. Each replacement metal gate structure includes an inner gate dielectric layer 260, and an outer bi-metallic layer. In one embodiment, the inner gate dielectric layer 260 is a 2-5 nm thick layer of a high-k material such as hafnium oxide ($HfO_2$), and the outer metallic layer includes a work function metal 262, e.g., a 3-6 nm thick layer of titanium nitride (TiN) or titanium carbide (TiC), and a gate electrode 264, e.g., tungsten (W). The gate electrode 264 is then recessed below the pad oxide 236 using a CMP process, and the recessed area is filled with an insulating gate cap 266 such as a carbon compound, e.g., SiBCN or amorphous carbon, or alternatively, $AlO_2$. The insulating gate cap 266 is then planarized, to stop on the fin hard mask 238. The multi-layer metal gate structures thus formed abut opposite sides of the fins 232, 234 to control current flow in the conduction channel of the TFET.

Figure 10:
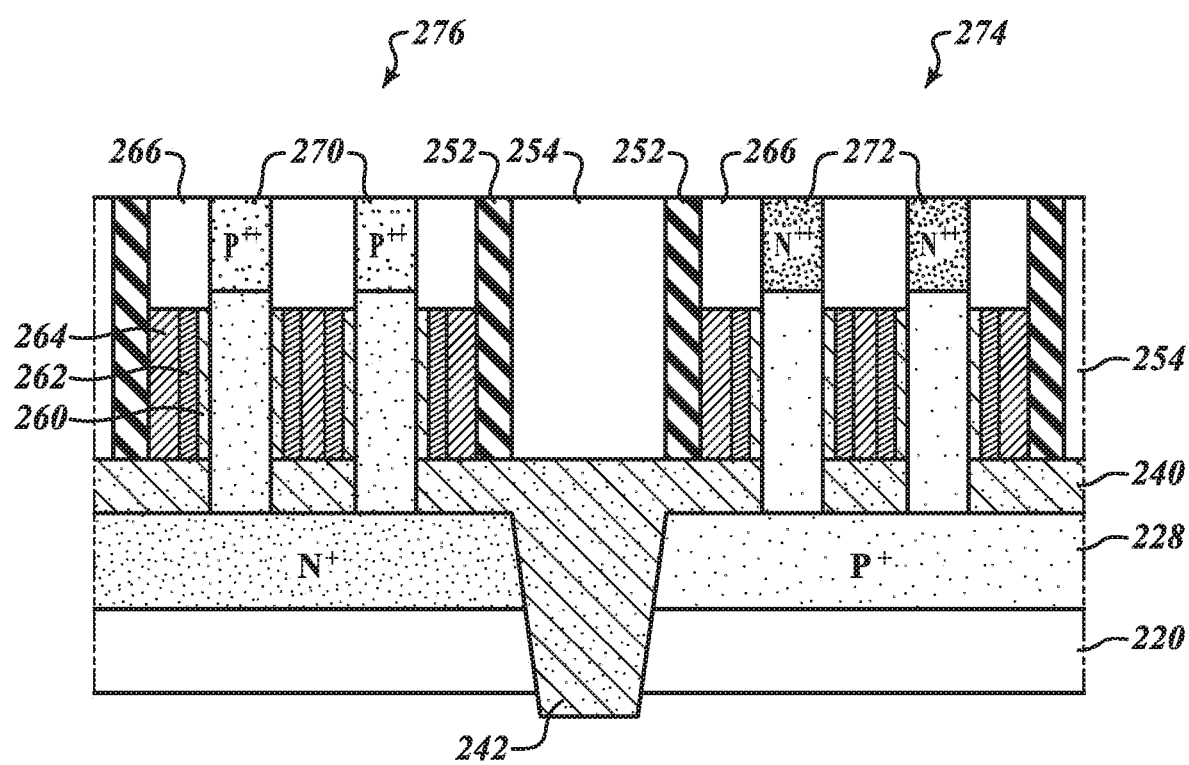
FIG. 10 is a cross-sectional view of a completed pair of tunneling FinFETs fabricated using the method shown in FIG. 3.

At 212, the fin hard mask 238 is replaced with heavily-doped silicon to form heavily doped source regions on top of the fins 232, 234, in line with the doped drain regions 230, 228, as shown in FIG. 10. The source region formation begins by covering both the NFET and PFET with a SiBCN hard mask.

First, the SiBCN hard mask is opened to expose the NFET. Opening the SiBCN hard mask is accomplished by conventional patterning techniques, e.g., lithography and reactive ion etching or wet etching. The fin hard mask 238 is then removed from the n-type fin 232, for example, by using a wet etchant such as hydrofluoric acid (HF), or a combination of HF and ethylene glycol (EG), both of which provide good selectivity to silicon and SiBCN. A $P^{++}$ source region 270 made of highly boron-doped silicon (Si) or silicon germanium (SiGe) is then epitaxially grown from the top surface of the n-type fin.

Next, the SiBCN hard mask is opened to expose the PFET. The fin hard mask 238 is removed from the p-type fin 234 as described above. Then, an $N^{++}$ source region 272 made of highly arsenic- or phosphorous-doped silicon (Si) or silicon carbide (SiC) is epitaxially grown from the top surface of the p-type fin. Finally, the remaining SiBCN hard mask is removed.

The concentration of dopants in the $P^{++}$ source region 270 and the $N^{++}$ source region 272 is in the range of about 2.0-3.0 E 20 $cm^{-3}$. Formation of the $N^{++}$ source region 272 and the $P^{++}$ source region 270 complete the p-type tunneling FInFET 274 and the n-type tunneling FinFET 276, respectively.

At 214, a second ILD layer 278 is deposited over the completed tunneling FInFETs 274, 276, followed by formation of contacts to the gate, source, and drain terminals, in the usual way. Contacts 280, 281, 282, 284, 286 can be formed using conventional patterning methods well known in the art. Some or all of the contacts can be designed to have different shapes, for example, circular contacts as shown in FIG. 11 or square contacts as shown in FIG. 13, or any other suitable polygonal shape.

FIGS. 11 and 13 show a top plan view of the completed tunneling FinFET devices after formation of $P^{++}$ source contacts 280, $N^{++}$ source contacts 281, gate contacts 282, $N^+$ drain contacts 284, and $P^+$ drain contacts 286. FIG. 12 shows a cross-sectional view of the completed tunneling FInFETs 274, 276 along a cut line that passes through the gate contacts 282.

FIG. 14 shows a cross-sectional view of the completed tunneling FInFETs 274, 276 along a cut line that passes through the source contacts 280, 281 and the drain contacts 284, 286. Thus, a pair of NFET and PFET vertical transistor devices are formed together using existing CMOS process technology, wherein all of the terminals are electrically accessible from the front side, without reliance on a backside contact.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A method, comprising:
    forming a first source/drain layer in a substrate;
    forming a channel layer over the first source/drain layer;
    forming a sacrificial layer over the channel layer;
    forming a second source/drain layer directly over and abutting the channel layer after the channel layer has been formed and by removing the sacrificial layer, the second source/drain layer having a different conductivity type from the first source/drain layer;
    forming an isolation layer on the first source/drain layer and laterally abutting the channel layer; and
    forming a gate structure laterally abutting a first portion of a sidewall surface of the channel layer, the gate structure exposing a second portion of the sidewall surface of the channel layer extending laterally from an edge of the gate structure.

2. The method of claim 1 wherein forming the gate structure includes forming the gate structure over the isolation layer and below the second source/drain layer.

3. The method of claim 1, wherein forming the gate structure includes:
    forming a gate dielectric layer abutting a channel region on a sidewall of the channel layer;
    forming a conductive work function adjustment layer abutting the gate dielectric layer; and
    forming a gate electrode abutting the conductive work function adjustment layer, the conductive work function adjustment layer positioned between the gate dielectric layer and the gate electrode.

4. The method of claim 1, wherein forming the first source/drain layer includes doping the first source/drain layer; and forming the second source/drain layer includes doping the second source/drain layer.

5. The method of claim 1, wherein forming the channel layer includes doping the channel layer with a same conductivity type as the first source/drain layer.

6. The method of claim 5, wherein the channel layer is doped with a smaller dopant concentration than the first source/drain layer.

7. The method of claim 1, comprising forming an vertical isolation wall over the isolation layer and laterally adjacent to the gate structure, the gate structure positioned laterally between the isolation wall and the channel layer.

8. The method of claim 1, comprising forming a mask layer over the channel layer,
wherein forming the second source/drain layer over the channel layer includes removing the mask layer.

9. A method, comprising: forming a stack structure over a doped region of a substrate, the stack structure including a semiconductor fin structure and a sacrificial layer over the semiconductor fin structure;
forming a first isolation layer surrounding a lower portion of the semiconductor fin structure;
forming a second isolation layer over the first isolation layer and laterally to the stack structure, the second isolation layer spaced apart from a sidewall of the semiconductor fin structure;
forming a gate structure over the first isolation layer and between the semiconductor fin structure and the second isolation layer after forming the semiconductor fin structure and the second isolation layer, the gate structure laterally abutting a first portion of a sidewall surface of the semiconductor fin structure, the gate structure exposing a second portion of the sidewall surface of the semiconductor fin structure extending laterally beyond an edge of the gate structure;
removing the sacrificial layer; and
forming an epitaxy semiconductor layer directly over and abutting the semiconductor fin structure after removing the sacrificial layer.

10. The method of claim 9, further comprising forming a trench isolation in the substrate laterally to the doped region.

11. The method of claim 10, wherein the trench isolation is formed integrally with the first isolation layer.

12. The method of claim 9, wherein the gate structure vertically extending from the first isolation layer to a level below an interface between the semiconductor fin structure and the sacrificial layer.

13. A method, comprising: forming a fin over a doped region in a substrate, the fin extending substantially perpendicular to a surface of the doped region, the fin including: a first semiconductor region abutting the surface of the doped region; and
a mask layer overlaying the first semiconductor region;
forming a second semiconductor region overlying and directly abutting the first semiconductor region after forming the fin and by removing the mask layer, the second semiconductor region being a channel region doped with a different conductivity type from the doped region in the substrate;
forming an isolation layer on the surface of the doped region and abutting lower portions of sides of the first semiconductor region;
forming a gate structure abutting opposite sides of the first semiconductor region, the gate structure comprising two gate dielectric layers and two gate electrodes having bottom surfaces abutting the isolation layer;
forming a first gate contact on the gate structure, the first gate contact being adjacent to a first side of the fin; and
forming a second gate contact on the gate structure, the second gate contact being adjacent to a second side of the fin that is opposite to the first side.

14. The method of claim 13, wherein the gate structure includes the two gate dielectric layers abutting opposite sides of the first semiconductor region, respectively, two work function adjustment layers abutting the two gate dielectric layers, respectively, and the two gate electrodes abutting the two work function adjustment layers, respectively.

15. The method of claim 13, wherein the first semiconductor region is doped with a same conductivity type as and a lower dopant concentration than one of the second semiconductor region or the doped region in the substrate.

16. The method of claim 13, wherein a dopant concentration of the second semiconductor region is at least 2-3 times greater than a dopant concentration of the doped region in the substrate.

17. The method of claim 15, wherein a dopant concentration of the doped region in the substrate is at least 10 times greater than a dopant concentration of the first semiconductor region.

18. The method of claim 13, wherein the fin has a fin width within a range of about 6-12 nm.

19. The method of claim 13, comprising forming an isolation wall of silicon nitride, the gate structure being positioned between the first semiconductor region and the isolation wall.

20. The method of claim 13, wherein the mask layer includes a hard mask layer and a pad oxide layer.

* * * * *